(12) United States Patent
Jiang

(10) Patent No.: US 11,209,129 B2
(45) Date of Patent: Dec. 28, 2021

(54) LIGHT APPARATUS

(71) Applicant: XIAMEN ECO LIGHTING CO. LTD., Xiamen (CN)

(72) Inventor: Hong Kui Jiang, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/776,478

(22) Filed: Jan. 29, 2020

(65) Prior Publication Data
US 2020/0240593 A1 Jul. 30, 2020

Related U.S. Application Data

(60) Provisional application No. 62/798,401, filed on Jan. 29, 2019.

(51) Int. Cl.
| | | |
|---|---|---|
| *F21K 9/235* | (2016.01) | |
| *H01L 25/075* | (2006.01) | |
| *F21K 9/232* | (2016.01) | |
| *F21K 9/278* | (2016.01) | |
| *H01L 33/50* | (2010.01) | |
| *F21K 9/64* | (2016.01) | |
| *H05B 45/20* | (2020.01) | |
| *F21Y 115/10* | (2016.01) | |
| *F21Y 113/13* | (2016.08) | |
| *F21V 9/40* | (2018.01) | |

(52) U.S. Cl.
CPC ............ *F21K 9/235* (2016.08); *F21K 9/232* (2016.08); *F21K 9/278* (2016.08); *F21K 9/64* (2016.08); *H01L 25/0753* (2013.01); *H01L 33/504* (2013.01); *F21V 9/40* (2018.02); *F21Y 2113/13* (2016.08); *F21Y 2115/10* (2016.08); *H05B 45/20* (2020.01)

(58) Field of Classification Search
CPC .......... F21K 9/235; F21K 9/278; F21K 9/232; F21K 9/64; F21Y 2113/20; H01L 31/08; H01L 31/12; H01L 31/02322; H01L 33/504; H01L 25/0753; F21V 9/40; F21V 9/45
See application file for complete search history.

(56) References Cited

U.S. PATENT DOCUMENTS

| | | | | |
|---|---|---|---|---|
| 6,527,422 B1 * | 3/2003 | Hutchison | ............. | F21V 29/505 362/290 |
| 2007/0145401 A1 * | 6/2007 | Ikehara | ............... | H01L 25/0753 257/98 |
| 2009/0212305 A1 * | 8/2009 | Harada | ..................... | F21K 9/00 257/88 |
| 2009/0303694 A1 * | 12/2009 | Roth | ..................... | H05B 45/00 362/84 |

(Continued)

*Primary Examiner* — Bryon T Gyllstrom
*Assistant Examiner* — Christopher E Dunay
(74) *Attorney, Agent, or Firm* — Chun-Ming Shih; Lanway IPR Services

(57) ABSTRACT

A lighting apparatus includes multiple LED packages, a substrate and a driver. The LED package module includes a package housing, a LED chip and a second LED chip, a first fluorescent layer, and a second fluorescent layer. The first fluorescent layer is stacked below the second fluorescent layer. A light emitting area of the first chip is placed in the first fluorescent layer. A light emitting area of the second chip is placed in the second fluorescent.

20 Claims, 9 Drawing Sheets

(56) References Cited

U.S. PATENT DOCUMENTS

| | | | | |
|---|---|---|---|---|
| 2012/0014091 A1* | 1/2012 | He | ................... | H01L 25/0753 362/97.1 |
| 2013/0058080 A1* | 3/2013 | Ge | ................... | F21V 29/004 362/231 |
| 2014/0191258 A1* | 7/2014 | Akimoto | ............ | H01L 33/508 257/88 |
| 2015/0014715 A1* | 1/2015 | Hsing Chen | ........ | H01L 25/0753 257/89 |
| 2016/0149098 A1* | 5/2016 | Song | ............... | H01L 25/0753 362/612 |
| 2017/0236982 A1* | 8/2017 | Akiyama | ............. | H01L 33/54 315/185 R |
| 2018/0315902 A1* | 11/2018 | Zhang | ............... | H01L 33/507 |
| 2019/0323697 A1* | 10/2019 | He | ................... | C09J 11/04 |
| 2020/0166182 A1* | 5/2020 | Yeung | ............... | F21V 23/001 |
| 2020/0168660 A1* | 5/2020 | Lee | ................... | H01L 33/502 |

\* cited by examiner

Fig.. 2

LIGHT APPARATUS

RELATED APPLICATION

The present application claims priority of U.S. patent application No. 62/798,401.

FIELD

The present invention is related to a lighting apparatus and more particularly related to a LED lighting apparatus.

BACKGROUND

There are various light devices in the world. After Edison invented light bulbs, related technologies are still developing, particularly after the LED (Light Emitted Diode) devices are introduced to the world.

LED has many advantages compared with past technology. There is a trend to replace traditional light devices with LED light devices, because LED light devices have better luminous efficacy while converting electricity.

In some applications, luminance level is not the only factor to concern. For examples, filament light bulbs are welcome because they have nice looking and cause people to remember their best memory. There are lots of filament light bulbs in various places, particularly for decoration purposes.

When trying to apply LED technology on filament light bulbs, there are many difficult problems to solve, including but not limited to heat dissipation, appearance, robustness, etc.

Therefore, it is very beneficial to develop a cost-effective solution for finding ways to apply LED technology in filament bulb applications.

SUMMARY

In some embodiments, a lighting apparatus includes multiple LED package modules. These LED package modules may be the same or may be different in different embodiments. In some LED package modules, the LED package module includes a package housing, a LED chip and a second LED chip, a first fluorescent layer, and a second fluorescent layer. The first fluorescent layer is stacked below the second fluorescent layer. The light emitting area of the first chip is placed in the first fluorescent layer. A light emitting area of the second chip is placed in the second fluorescent.

For example, platforms for supporting the first LED chip and the second LED chip may have different heights so that the first LED chip is located lower than the second LED chip, thus keeping the light emitting area of the first LED in the first fluorescent layer and the light emitting area of the second LED chip in the second fluorescent layer stacked above the first fluorescent layer.

In some other embodiments, the first fluorescent layer and the second fluorescent layer are stacked above the first LED chip but only the second fluorescent layer, excluding the first fluorescent layer, covers the second LED chip.

The lighting apparatus also includes a substrate for mounting the multiple LED package modules. The lighting apparatus also includes a driver for converting an external power to a driving power supplying to the multiple LED package modules.

In some embodiments, the LED package module further includes a third LED chip and a third fluorescent layer. A light emitting area of the third LED chip is in the third fluorescent layer. In such case, there are three different heights for locating the first LED chip, the second LED chip and the third LED chip. With such design, light of the first LED chip passes through three fluorescent layers. Light of the second LED chip passes through two fluorescent layers and light of the third LED chip passes through one fluorescent layer. Therefore, even the first LED chip, the second LED chip and the third LED chips are the same but the final output light of the first LED chip, the second LED chip and the third LED chip are different.

In some embodiments, the LED package module further includes a third LED chip and a fourth LED chip. The third LED chip emits a first white light and the fourth LED chip emits a second white light. The first white light and the second white light have different color temperatures. In other words, the same LED package module contains two types of white color temperature LED light sources. By adjusting a relative ratio of currents supplying to the third LED chip and the fourth LED chip, different white light color temperatures may be generated.

In some embodiments, the first LED chip and the second LED chip emits different output colors after passing through the first fluorescent layer and the second fluorescent layer. In other words, the first LED chip and the second LED chips may generate different optical parameters, e.g. different color or different color temperatures.

In some embodiments, the third LED chip is covered with a third fluorescent layer and the fourth LED chip is covered with a fourth fluorescent layer. The third LED chip and the fourth LED chip are the same type of LED chips but emit white lights with different color temperatures because of the third fluorescent layer and the fourth fluorescent layer.

In some embodiments, the third LED chip and the fourth LED chip are covered by the second fluorescent layer.

In some embodiments, the LED package module has a third LED chip and a third fluorescent layer. The third fluorescent layer is stacked above the second fluorescent layer and a light emitting area of the third LED chip is placed in the third fluorescent layer.

In some embodiments, the LED package module has a first pad line and a second pad line respectively connected to a first terminal and a second terminal of the first LED chip for receiving the driving power. The first pad line includes multiple pads respectively corresponding to first terminals of multiple first or second LED chips. The second pad line includes multiple pads respectively corresponding to second terminals of the multiple first or second LED chips. In some embodiments, the first LED chips may be further connected in series and then connected to the first pad line and the second pad line. In some embodiments, the first LED chip and the second LED chip are connected in parallel by connecting the first pad line and the second pad line.

In some embodiments, a first terminal and a second terminal of the second LED chip are respectively connected to the first pad line and the second pad line for receiving the driving power.

In some embodiments, the lighting apparatus also includes a bulb shell. There are multiple substrates mounted respectively mounted with the multiple LED package modules.

In some embodiments, the multiple substrates are elongated strips with a top end connected structurally to support each other.

In some embodiments, the multiple substrates are attached and supported by a central column. For example, the multiple substrates are arranged as a cone shape with a wider bottom area and supported to each other at top area of the multiple substrates.

In some embodiments, the substrate is flexible and bent as a spiral shape.

In some embodiments, the lighting apparatus of claim also includes a back fluorescent layer attached on a back side of the substrate, where a front side of the substrate is mounted with the multiple LED package modules. In some embodiments, the substrate is transparent so that the light of the first LED chip and the second LED chip may pass through the substrate. In some other embodiments, the substrate is not transparent but light of one substrate may be emitted to the back fluorescent layer of another substrate while there are multiple substrates in the lighting apparatus.

In some embodiments, there are two flexible substrates respectively mounted with the LED package modules twinning to each other in a spiral manner.

In some embodiments, the lighting apparatus also includes a light tube. The substrate is extended to be fixed at two ends of the light tube. The driver comprises a first part and a second part located at two ends of the light tube.

In some embodiments, the first LED chips in different LED package modules receive a first driving current and the second LED chips in different LED package modules receive a second driving current. A mixed optical parameter of the first LED chips and the second LED chips is adjusted by changing a relative ratio between the first driving current and the second driving current.

In some embodiments, the first LED chips in different LED package modules receive different driving current values.

In some embodiments, the driver provides different driving current values to the first LED chips in different LED package module according to positions of the LED package modules mounted on the substrate.

In some embodiments, the package housing has a lateral wall with a tilt angle gradually expanded from a bottom part to a top part.

DETAILED DESCRIPTION

Figure 1:
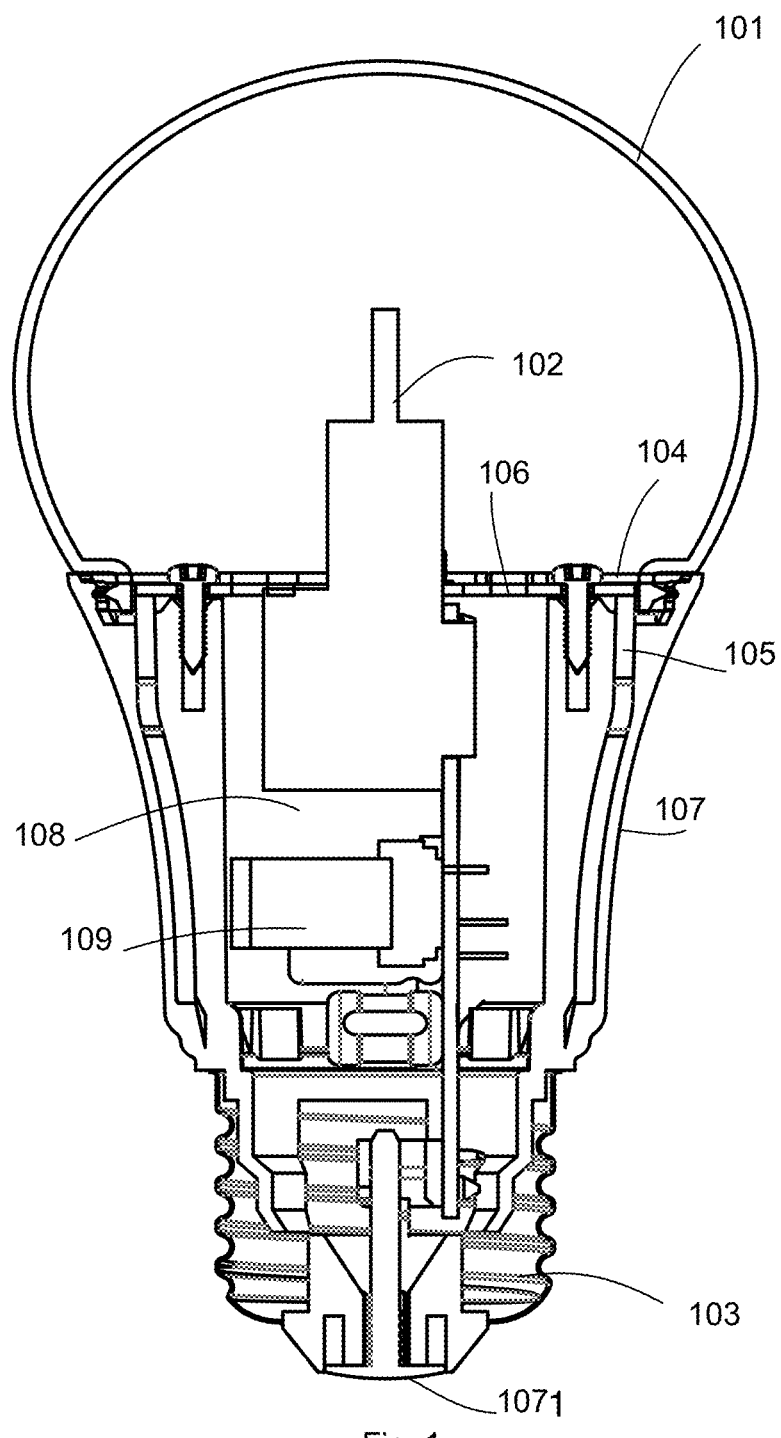
FIG. 1 illustrates a light bulb example.

This invention implements following concept in various light bulbs, downlight light, spot lights, any luminous devices and/or electronic devices with light components. LED (Light Emitted Diode) modules, not limited, are preferred in following embodiments.

In an embodiment, a light apparatus includes a white set of LED modules and a non-white set of LED modules. The white set of LED modules include multiple LED modules with more than one type of optical characteristic. For example, the white set of LED modules has a first LED module with a first color temperature that is close to sunrise sunshine. In addition, the white set of LED modules also has a second LED module with a second color temperature that is close to noon time sunshine. Both the first LED module and the second LED module are "white" LED modules although they may have different color temperatures.

The non-white set of LED modules may include LED modules with multiple colors that are not white. For example, the LED modules in the non-white LED set may emit red light, blue light or green light.

The LED modules in the white set of LED modules or the non-white set of LED modules may contain the same LED chips, e.g. blue light LED chips, covered with different fluorescent layers for converting the original light of the LED chips to desired optical characteristic, e.g. white lights with different color temperatures, red light, green light or blue light.

The light apparatus includes a driver circuit for providing a driving current supplying to the white set of LED modules and the non-white set of LED modules. The driver circuit may supply different current to change emitted light strengths of the white set of LED modules and the non-white set of LED modules to blend a mixed overall light of the LED light apparatus. For example, the LED modules of different color temperatures in the white set of LED modules receive different currents to adjust overall color temperature of the white set of LED modules. In the example mentioned above, the first LED module may receive a 0.05 A current and the second LED module may receive a 0.50 A current. The overall color temperature would appear with a 1 to 10 ratio between the color temperatures of the first LED module and second LED module. By changing the current ratio, the overall color temperature may be adjusted to a desired value dynamically. In addition to change the current, the overall mixed light optical characteristic may also be adjusted by other techniques like adjusting duty ratio of the LED module.

In an embodiment, the white set of LED modules and the non-white set of LED modules are categorized into two groups operated in separate modes respectively. Specifically, in such embodiment, the white set of LED modules and the non-white set of LED modules are not operated at the same time for mixing a desired optical characteristic.

For example, the light apparatus may have a first mode and a second mode. In the first mode, the white set of LED modules are turned on while the non-white LED modules are turned off. In the first mode, the LED modules with different color temperatures or other optical characteristic may be adjusted respectively to mix a desired color temperature or other optical characteristic as mentioned above. In the second mode, the non-white set of LED modules are turned on, and the LED modules in the non-white set of LED modules are adjusted separately for mixing a desired color or other optical characteristic. In other words, in such embodiments, the white set of LED modules are not used together with the non-white set of LED modules for mixing a desired optical characteristic. The light apparatus has the white set of LED modules and the non-white set of LED modules at the same time, but the two sets of LED modules are not combined for mixing a desired optical characteristic.

In a white light mode (the first mode mentioned above), the output white light is generated by one or more white LEDs. The white LEDs (the white set of LED modules) can have different color temperatures so that the user can adjust to a specific color temperature by mixing the different white LEDs. None of the R, G, and B LEDs (the non-white set of LED modules) emit light in the white light mode. In other words, the white output light is generated by only mixing light from different white LEDs, not by using any R or G or B LEDs. In one embodiment, Ra8 of the white light mode is always lower than 85.

In a color light mode (the second mode mentioned above), the output color light is generated only by mixing the R, G, and B LEDs. None of the white LEDs emit light in the color light mode. That is, the output color light is generated only by mixing light from the R, G, B LEDs, not by using any of the white LEDs.

Thus, in this case, the whites LEDs and the R, G, B LEDs do not emit light simultaneously.

Figure 2:
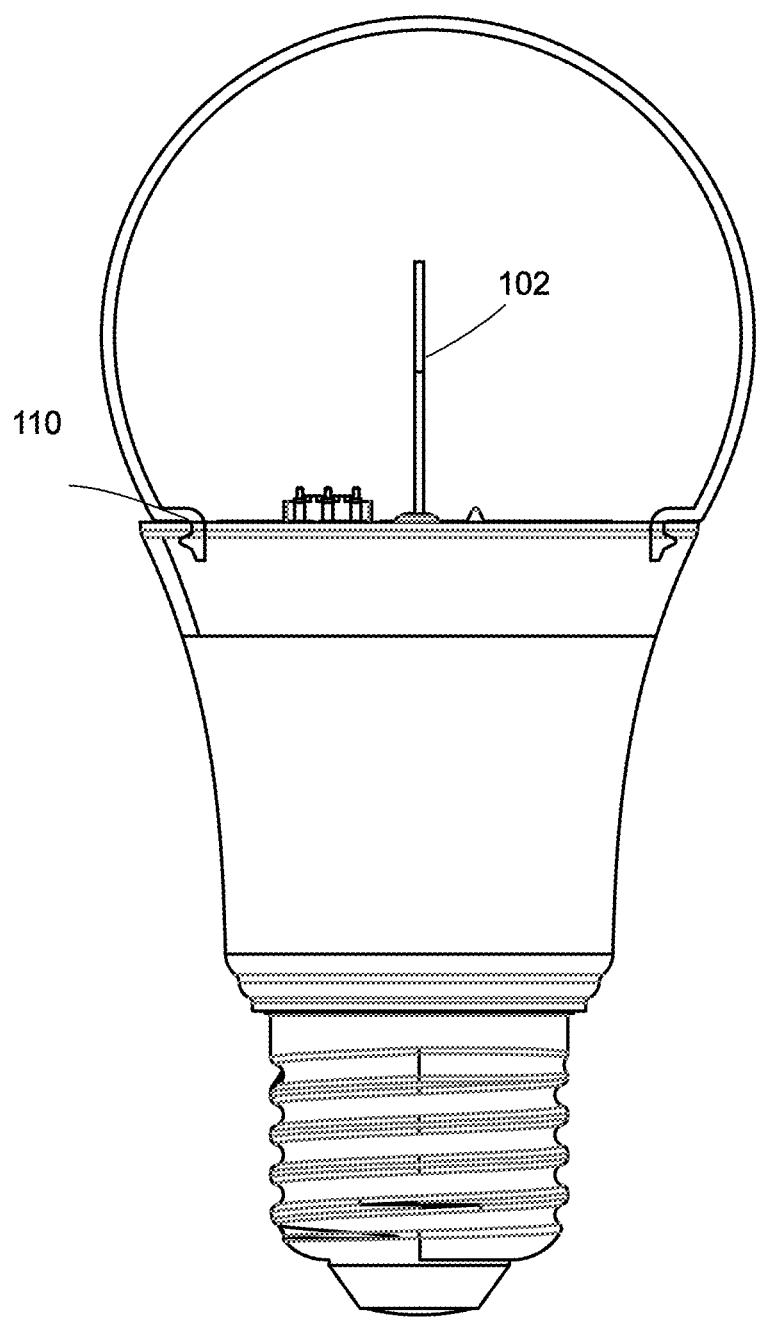
FIG. 2 illustrates a second view of the light bulb example of FIG. 1.
Figure 3:
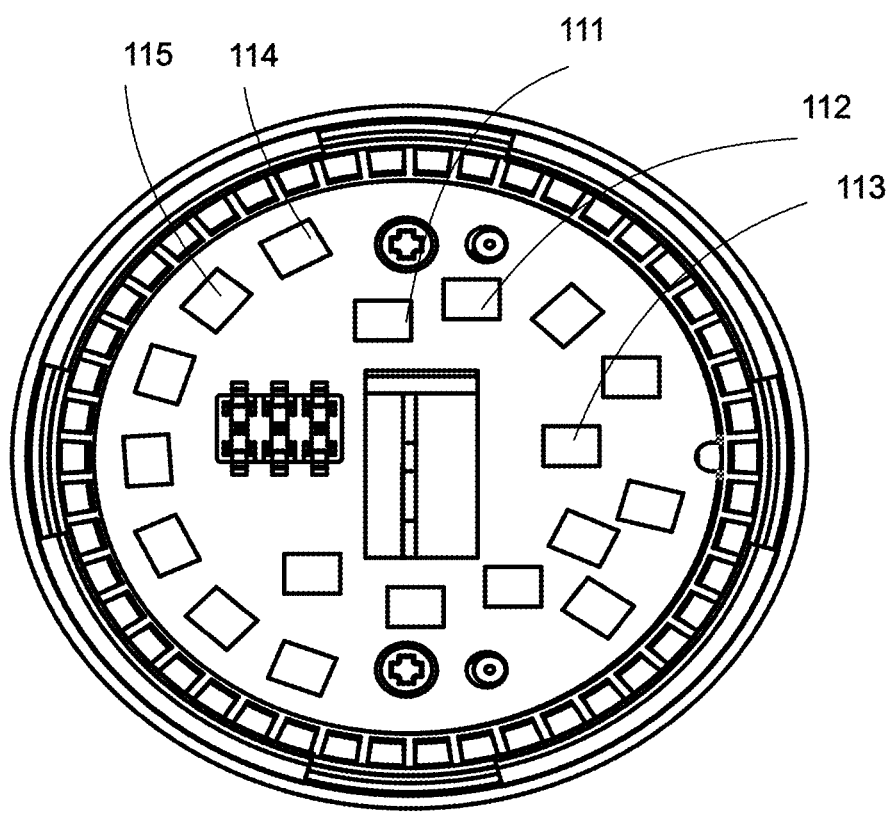
FIG. 3 illustrates a third view of the light bulb example of FIG. 1.

Please refer to FIG. 1, FIG. 2 and FIG. 3, which illustrate a light bulb example implementing the concept mentioned above.

In FIG. 1, a light bulb, as a light apparatus, includes a bulb shell 101, a bulb body housing 107. There is a plugging terminal 1071 inserted to a bottom of the bulb body housing 107. A heat sink component 105 like a metal cup is attached for bringing heat of a light source plate 104 to the bulb body housing 107.

There is a driver circuit board enclosed by the bulb body housing 107. The driver circuit is connected to the plugging terminal 1071 and the cap terminal 103 for receiving an external power source. The driver circuit board is mounted with a driver circuit 109 and a wireless circuit 108. The driver circuit 109 generates one or multiple driving currents by converting the external power source, like 110V or 220V alternating current source.

The wireless circuit 108 is used for receiving and/or sending a status to an external device like a mobile phone or a remote control. The commands from the external device may indicate the driver circuit 109 to change current or duty ratio to a white set of LED components and a non-white set of LED components.

The light source plate 104 mounted with the LED modules has a pluggable socket 106 for receiving a pin of the driver circuit board for supplying electricity to the LED modules on the light source plate 104. By using the pluggable socket 106, welding may be replaced with an easier assembling structure. The wireless circuit 108 may implement one or multiple wireless protocols like Wi-Fi, Bluetooth, Zigbee, Z-wave and an antenna 102 is protruding upwardly for transmitting and/or receiving signal for the wireless circuit 108. 1

In FIG. 2, the bulb shell has an elastic hook 110 to be connected to the bulb body housing, which may strengthen the structure of the light apparatus.

In FIG. 3, there is a white set of LED modules and a non-white set of LED modules. The white set of LED modules include a first white LED module 114 and a second white LED module 115. The first white LED module 114 and the second white LED module 115 are both white LED modules but have different color temperatures. As mentioned above, in a first mode, the first white LED module 114 and the second white LED module 115 may be adjusted for mixing a desired color temperature.

The non-white set of LED modules has a red LED module 111, a green LED module 112, a blue LED module 113. By adjusting current or duty ratio of the red LED module 111, the green LED module 112 and the blue LED module 113, the light apparatus may emit different light colors in the second mode.

Figure 4:
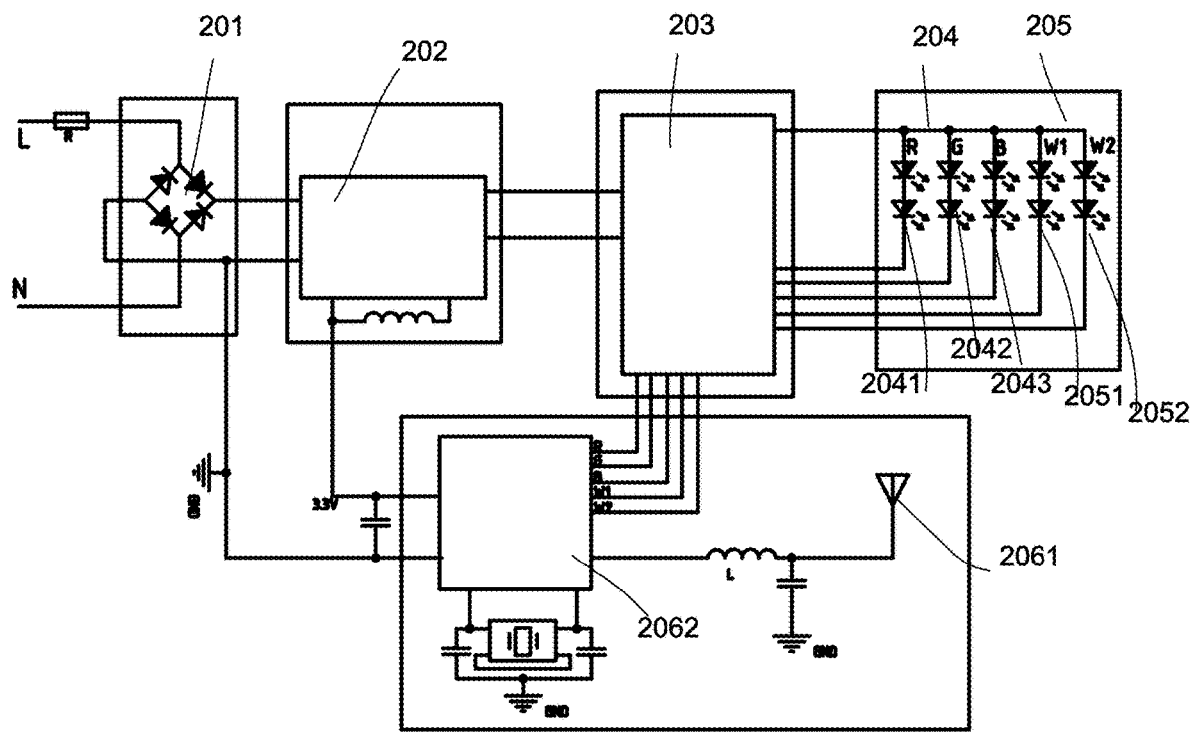
FIG. 4 illustrates a circuit example of a lighting apparatus.

In FIG. 4, an illustrative circuit diagram is provided for explaining how to implement the driver circuit.

In FIG. 4, the driver circuit has a bridge circuit 201 for filtering an AC current. A DC to AC converter 202 is used for generating a stable DC current supplying to a wireless circuit 2062 and a driver chip 203. The wireless circuit 2062 is connected to an antenna 2061 for receiving an external command. The driver chip 203 receives the DC current may be controlled by a manual switch, a default setting, or the external command received by the wireless circuit 2062 for generating separate driving currents respectively to a white set of LED components 205 and a non-white set of LED components 204. The white set of LED components 205 may have a first white LED component 2051 and a second white LED component 2052 with different color temperatures. The non-white set of LED components 204 may include a red LED component 2041, a green LED component 2042, a blue LED component 2043.

There are multiple ways to implement the circuit. For example, FIG. 5 illustrate another circuit design.

Figure 5:
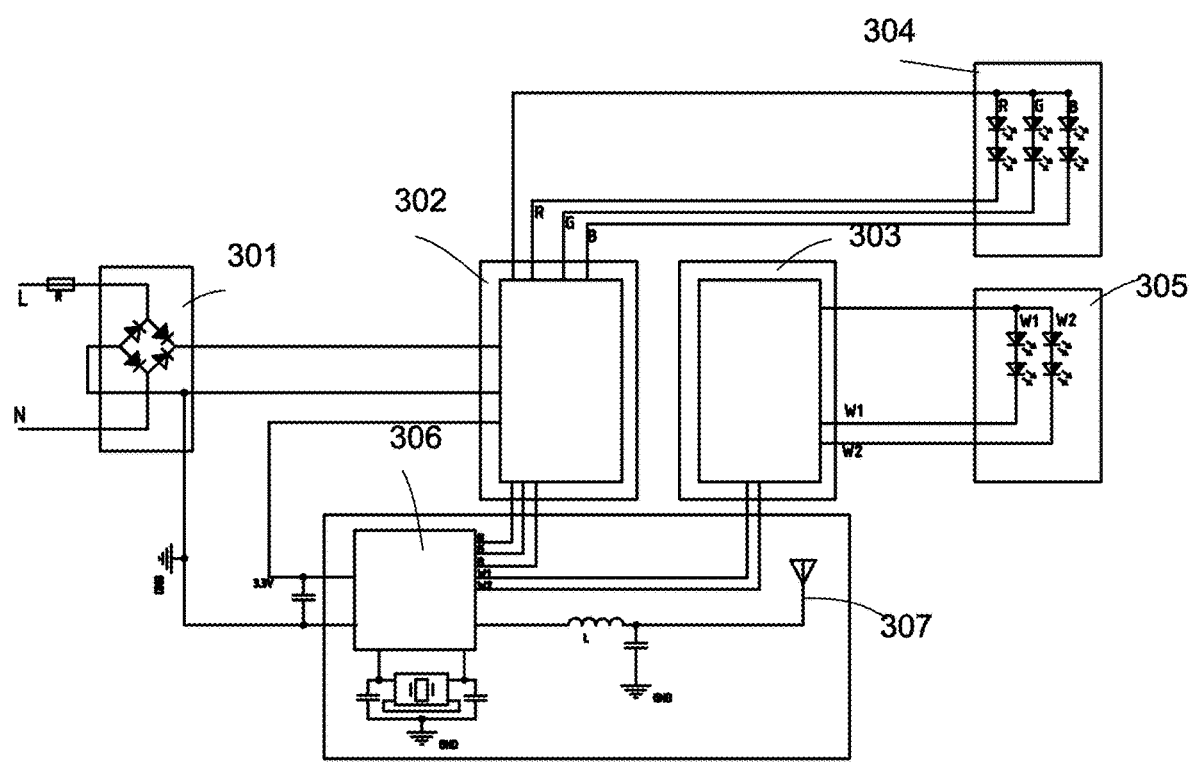
FIG. 5 illustrates a circuit example of a lighting apparatus.

In FIG. 5, the bridge circuit 301 filters an AC current. There are two AC-DC converters 302, 303 respectively supplying power to a white set of LED components 304 and a non-white set of LED components 305. The wireless circuit 306 receives signals from an antenna 307. The signals may include an external command for changing the currents of the AC-DC converters 302, 303 for changing color temperatures or colors as mentioned above in the first mode or the second mode.

Figure 6A:
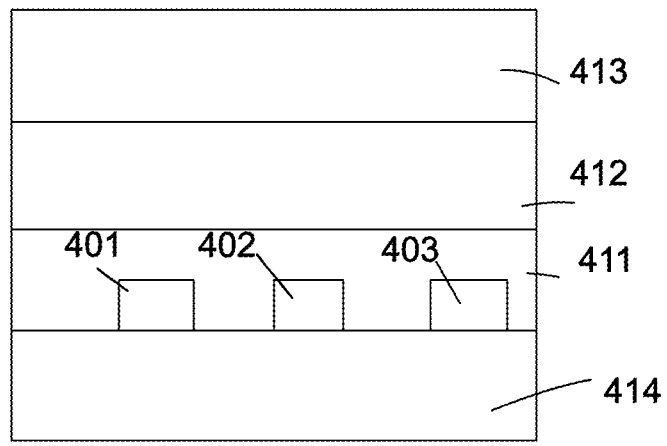
FIG. 6A illustrates a LED package module example.

In FIG. 6A, a LED package module is illustrated. The LED package module has multiple LED chips 401, 402, 403 mounted on a substrate 414 that emit lights with different optical parameters, e.g. different colors, spectrums. In this example, there are three fluorescent layers 411, 412, 413 covering the LED chips 401, 402, 403. When the LED chips 401, 402, 403 have different optical parameters, the lights through the same fluorescent layers 411, 412, 413 provide output lights with different optical parameters, e.g. different color temperatures, different colors.

Figure 6B:
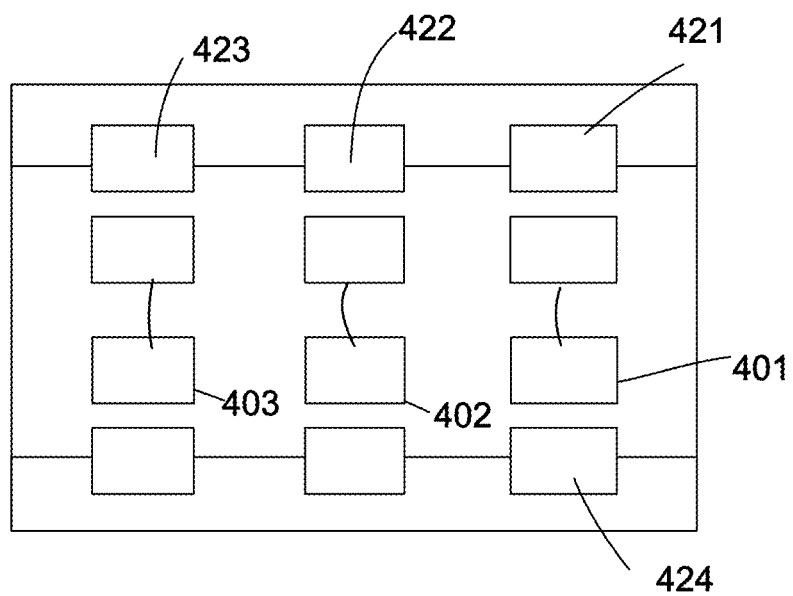
FIG. 6B illustrates another view of the example in FIG. 6A.

In FIG. 6B, the LED package module is illustrated from a top view. In FIG. 6B, the LED chips 401, 402, 403 are wired to the same types of LED chips, e.g. connected in series, and then electrically connected to pads 421, 422, 423, 424 for connecting to external circuits.

In FIG. 6B, multiple different LED chips may be integrated into one LED package module, which may be mounted in desired patterns on a light apparatus to achieve the needed optical effects.

Figure 7:
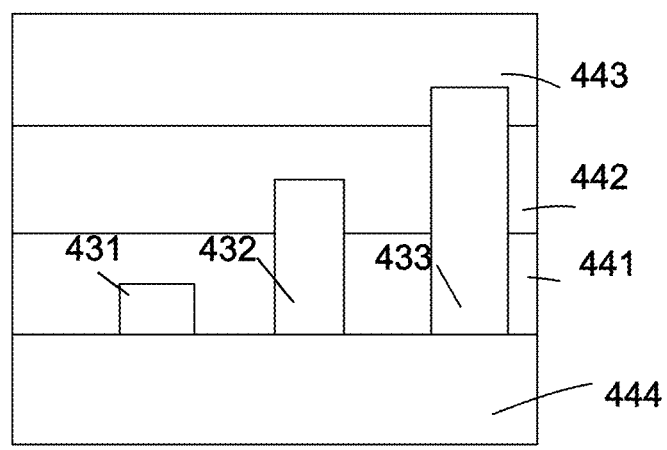
FIG. 7 illustrates another LED package module example.

In FIG. 7, LED chips 431, 432, 433 on a substrate 444 are placed with different heights so that when the LED chips 431, 432, 433 may emit different output lights when lights of the LED chips 431, 432, 433 passes through different layer combination of fluorescent layers 441, 442, 443, even the LED chips 431, 432, 433 are the same type of LED chips.

Figure 8:
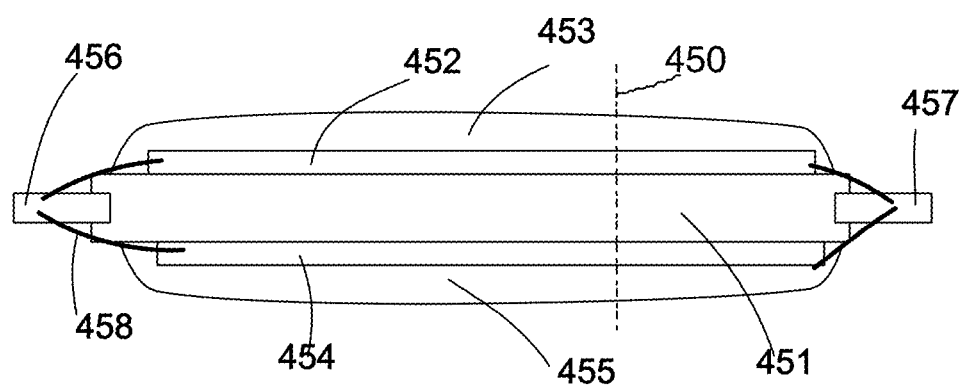
FIG. 8 illustrates a light strip example.

FIG. 8 illustrates a filament, which ratio is adjusted to be fit in a drawing. In FIG. 8, the filament includes a substrate 451, which may be a flexible substrate. In other words, the filament may be bent to a desired curve shape. The material of the flexible substrate may be selected from a flexible printed circuit board structure, and may be added with a thin aluminum layer for keep the bent shape when an external force applied thereon is removed.

LED chip layers 452, 454 are mounted on both sides of the substrate 451. Fluorescent layers 453, 455 cover the LED chip layers 452, 454 for generating desired optical spectrums. There are two electrodes 456, 457 disposed at two ends of the filament. LED chips on the LED chip layers 452, 454 may be connected in parallel, in series, or in series and in parallel, depending on design requirements.

Figure 9:
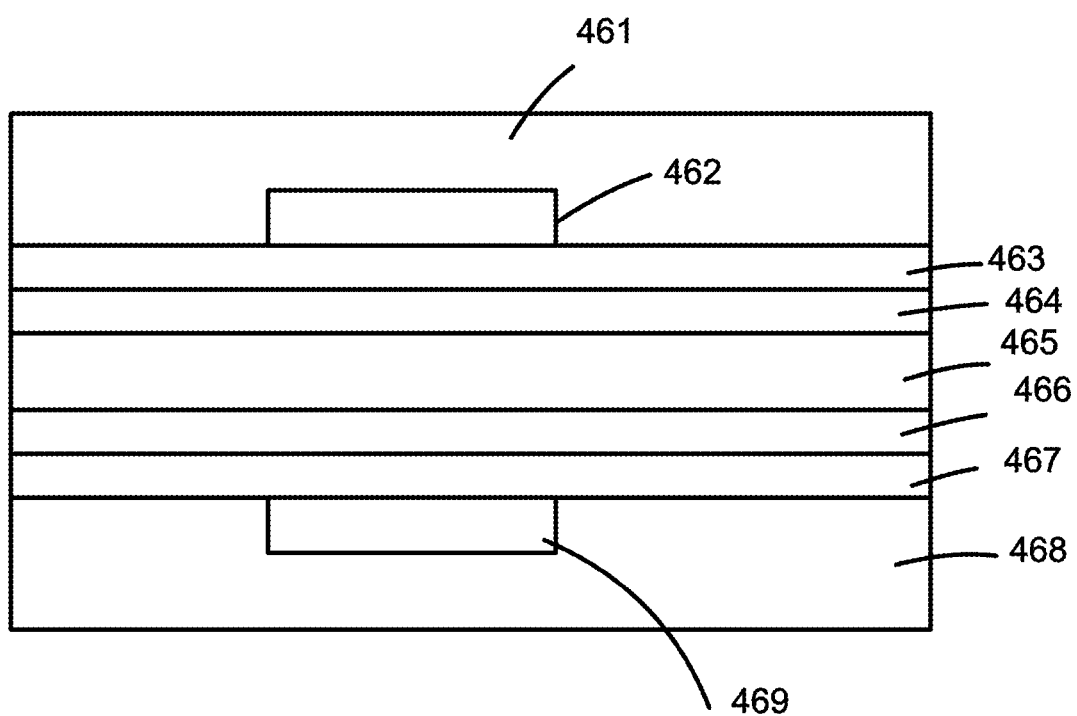
FIG. 9 illustrates a cross diagram of the cross-sectional line 450 in FIG. 8.

FIG. 9 illustrates a cross diagram of the cross-sectional line 450 in FIG. 8.

In FIG. 9, a substrate 465 is mounted with insulation layers 464, 466 on both sides. Metal conductor layers 463, 467 are disposed on the insulation layers 464, 466. LED chips 462, 469 are electrically connected to conductor layers 463, 467 to be connected with other LED chips in series or in parallel or connected to a driving current. Fluorescent layers 461, 469 cover the LED chips 462, 469.

In addition to the above-described embodiments, various modifications may be made, and as long as it is within the spirit of the same invention, the various designs that can be made by those skilled in the art are belong to the scope of the present invention

The invention claimed is:

1. A lighting apparatus, comprising:
   multiple LED package modules, the LED package module comprising a package housing, a first LED chip and a second LED chip, a first fluorescent layer, and a second fluorescent layer, wherein the first fluorescent layer is stacked below the second fluorescent layer, a light emitting area of the first chip is placed in the first fluorescent layer with a first height relative to the package housing, and a light emitting area of the second chip is placed in the second fluorescent layer with a second height relative to the package housing, wherein the first height is different from the second height;
   a substrate for mounting the multiple LED package modules; and
   a driver for converting an external power to a driving power supplying to the multiple LED package modules.

2. The lighting apparatus of claim 1, wherein the LED package module further comprises a third LED chip and a third fluorescent layer, a light emitting area of the third LED chip is in the third fluorescent layer.

3. The lighting apparatus of claim 1, wherein the LED package module further comprises a third LED chip and a fourth LED chip, wherein the third LED chip emits a first white light and the fourth LED chip emits a second white light, the first white light and the second white light have different color temperatures.

4. The lighting apparatus of claim 3, wherein the first LED chip and the second LED chip emits different output colors after passing through the first fluorescent layer and the second fluorescent layer.

5. The lighting apparatus of claim 3, wherein the LED package module further comprises a third LED chip and a fourth LED chip, the third LED chip is covered with a third fluorescent layer and the fourth LED chip is covered with a fourth fluorescent layer, and the third LED chip and the fourth LED chip are the same type of LED chips but render output white lights with different color temperatures when emitting lights respectively through the third fluorescent layer and the fourth fluorescent layer.

6. The lighting apparatus of claim 3, wherein the third LED chip and the fourth LED chip are covered by the second fluorescent layer.

7. The lighting apparatus of claim 1, wherein the LED package module has a third LED chip and a third fluorescent layer, the third fluorescent layer is stacked above the second fluorescent layer and a light emitting area of the third LED chip is placed in the third fluorescent layer.

8. The lighting apparatus of claim 1, wherein the LED package module have a first pad line and a second pad line respectively connected to a first terminal and a second terminal of the first LED chip for receiving the driving power.

9. The lighting apparatus of claim 8, wherein a first terminal and a second terminal of the second LED chip are respectively connected to the first pad line and the second pad line for receiving the driving power.

10. The lighting apparatus of claim 1, further comprising a bulb shell, wherein there are multiple substrates mounted respectively mounted with the multiple LED package modules.

11. The lighting apparatus of claim 10, wherein the multiple substrates are elongated strips with a top end connected structurally to support each other.

12. The lighting apparatus of claim 10, wherein the multiple substrates are attached and supported by a central column.

13. The lighting apparatus of claim 1, wherein the substrate is flexible and bent as a spiral shape.

14. The lighting apparatus of claim 13, further comprising a back fluorescent layer attached on a back side of the substrate, where a front side of the substrate is mounted with the multiple LED package modules.

15. The lighting apparatus of claim 14, wherein there are two flexible substrates respectively mounted with the LED package modules twinning to each other in a spiral manner.

16. The lighting apparatus of claim 1, further comprising a light tube, the substrate extended to be fixed at two end of the light tube, and the driver comprises a first part and a second part located at two ends of the light tube.

17. The lighting apparatus of claim 1, wherein the first LED chips in different LED package modules receive a first driving current and the second LED chips in different LED package modules receive a second driving current, a mixed optical parameter of the first LED chips and the second LED chips is adjusted by changing a relative ratio between the first driving current and the second driving current.

18. The lighting apparatus of claim 1, wherein the first LED chips in different LED package modules receive different driving current values.

19. The lighting apparatus of claim 18, wherein the driver provides different driving current values to the first LED chips in different LED package module according to positions of the LED package modules mounted on the substrate.

20. The lighting apparatus of claim 1, wherein the package housing has a lateral wall with a tilt angle gradually expanded from a bottom part to a top part.

* * * * *